United States Patent
Hsieh (10) Patent No.: US 9,016,353 B2
(45) Date of Patent: Apr. 28, 2015

(54) HEAT SINK CLIP AND METHOD FOR FORMING THE SAME

(75) Inventor: Ming-Yang Hsieh, Taichung (TW)

(73) Assignee: Ming-Yang Hsieh, Taichung (TW)

( * ) Notice: Subject to any disclaimer, the term of this patent is extended or adjusted under 35 U.S.C. 154(b) by 440 days.

(21) Appl. No.: 13/355,087

(22) Filed: Jan. 20, 2012

(65) Prior Publication Data

US 2013/0186595 A1     Jul. 25, 2013

(51) Int. Cl.
*H01L 23/40*      (2006.01)

(52) U.S. Cl.
CPC ..... *H01L 23/4093* (2013.01); *H01L 2924/0002* (2013.01)

(58) Field of Classification Search
CPC ..... H05K 7/20; H05K 7/2049; H01L 23/4093
USPC ........ 165/80.2, 80.1; 361/719, 690, 688, 689, 361/720; 257/718, 719
See application file for complete search history.

(56) References Cited

U.S. PATENT DOCUMENTS

| | | | | |
|---|---|---|---|---|
| 4,605,058 A | * | 8/1986 | Wilens | 165/80.2 |
| 6,535,387 B2 | * | 3/2003 | Summers et al. | 361/704 |
| 7,106,595 B2 | * | 9/2006 | Foster, Sr. et al. | 361/721 |
| 7,612,446 B2 | * | 11/2009 | Dang et al. | 257/707 |
| 7,715,197 B2 | * | 5/2010 | Tian et al. | 361/719 |

FOREIGN PATENT DOCUMENTS

TW      M300870 U    * 11/2006

* cited by examiner

*Primary Examiner* — Allana Lewin
*Assistant Examiner* — Raheena Rehman
(74) *Attorney, Agent, or Firm* — Muncy, Geissler, Olds & Lowe, P.C.

(57) ABSTRACT

A heat sink clip is provided for clipping a memory module. The heat sink clip is made from a flexible heat-conductive metal plate formed by bending, and includes a top plate and two side plates facing opposite. Each side plate has a top portion, an inwardly inclined portion and a lead. The top portions of the two side plates extend from two opposite side edges of the top plate, respectively, and incline inwardly. The inwardly inclined portions of the two side plates extend from bottoms of the two top portions, respectively, and continue to incline inwardly. The leads of the two side plates extend from bottoms of the two inwardly inclined portions, respectively, and incline outwardly.

11 Claims, 8 Drawing Sheets

HEAT SINK CLIP AND METHOD FOR FORMING THE SAME

BACKGROUND OF THE DISCLOSURE

1. Field of the Disclosure

The invention relates to a heat sink clip and method for forming the same, and more particularly, to a heat sink clip tightly clipping a memory module and improving to spread heat away from the memory module.

2. Brief Description of the Related Art

A traditional heat sink clip for a memory module, such as various heat sink clips disclosed in Taiwan patent No. M300870, is used to clip the memory module, directly contacting multiple chips of the memory module such that the heat sink clip can spread heat away from the chips.

Figure 14:
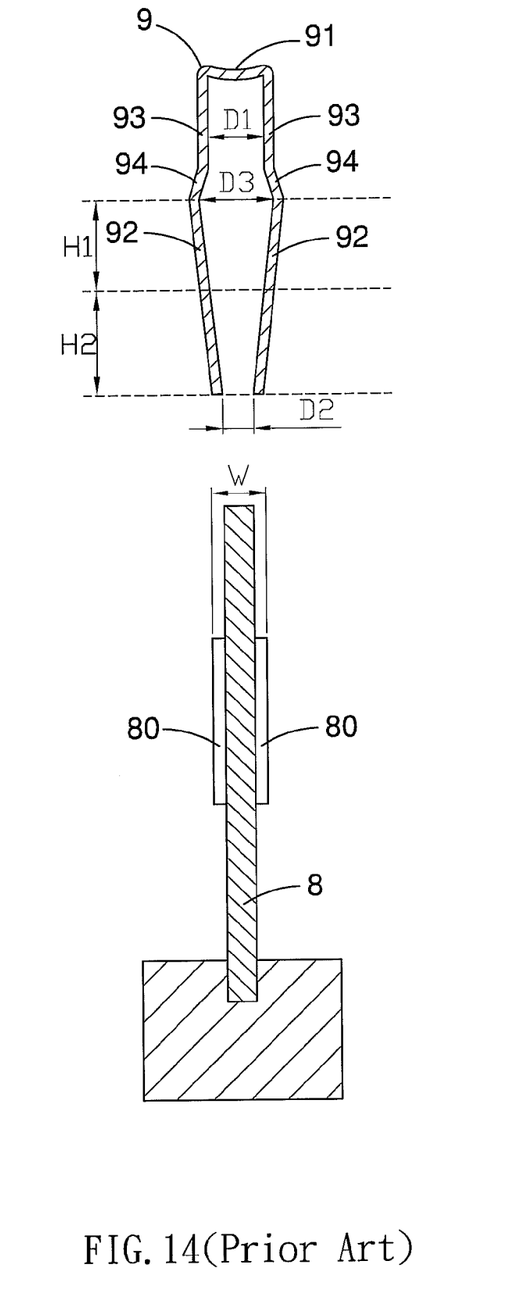
FIG. 14 is a cross sectional view of a heat sink clip of prior art.

FIG. 14 shows one of heat sink clips 9 with bends, used to clip a memory module 8, disclosed in the above patent. The memory module 8 has multiple chips 80 at front and back sides thereof, respectively. The heat sink clip 9 has a top surface 91, two inwardly inclined surfaces 92 and two parallel vertical portions 93.

A distance D1 between the two vertical portions 93 is equal to a thickness W of the memory module 8. A greatest distance D3 between two connection portions 94 is greater than the distance D1 between the two vertical portions 93 and greater than the thickness W of the memory module 8. Upper portions H1 of the two inwardly inclined surfaces 92 have portions having a distance between them that is greater than the thickness W of the memory module 8, and have portions having a distance between them that is the same as the thickness W of the memory module 8. Thus, with regards to the heat sink clip 9, the two vertical portions 93, the two connection portions 94 and the upper portions H1 of the two inwardly inclined surfaces 92 cannot provide a clipping force. The heat sink clip 9 only relies on lower portions H2 of the two inwardly inclined surfaces 92, that is, portions of the two inwardly inclined surfaces 92 have a distance between them that is less than the thickness W of the memory module 8, to clip the memory module 8. The other portions of the heat sink clip 9 cannot apply any clipping function to the memory module 8 such that the heat sink clip 9 does not tightly clip the memory module 8, resulting in poorly spreading heat.

Besides, with regards to a method for forming the heat sink clip 9, the two connection portions 94 are first bent outward and the two inwardly inclined surfaces 92 are then bent inward. Thus, it is relatively difficult to design and process a mold of the heat sink clip 9 and it is cost ineffectiveness. For current technology, the heat sink chip 9 with a special shape is difficulty formed using automatically punching.

SUMMARY OF THE DISCLOSURE

The present invention is directed to a heat sink clip for clipping a memory module. The heat sink clip is made from a flexible heat-conductive metal plate formed by bending, and includes a top plate and two side plates facing opposite. Each side plate has a top portion, an inwardly inclined portion and a lead. The top portions of the two side plates extend from two opposite side edges of the top plate, respectively, and incline inwardly, wherein a distance between joints of the top portions of the two side plates and the two opposite side edges of the top plate is substantially equal to a thickness of the memory module. The inwardly inclined portions of the two side plates extend from bottoms of the two top portions, respectively, and continue to incline inwardly such that bends are at joints of the two inwardly inclined portions and the two top portions, respectively. The leads of the two side plates extend from bottoms of the two inwardly inclined portions, respectively, and incline outwardly.

In one embodiment, in accordance with the present invention, a ratio of a distance between one of the bends at the heat sink clip and a top edge of a chip of the memory module to a distance between the top edge and a bottom edge of the chip ranges from 15% to 40%. Thus, the heat sink clip can provide improved clipping effects.

In one embodiment, in accordance with the present invention, multiple air vents are at the top portion of each side plate so as to improve heat spreading.

In one embodiment, in accordance with the present invention, the top plate has a planar bottom surface and a straight indent is at a top surface of the top plate and is substantially parallel to the two opposite side edges of the top plate.

The present invention is directed to another heat sink clip having similar functions to the above mentioned one. The heat sink clip includes a top plate and two side plates facing opposite. The top plate has a top surface, a planar bottom surface and two opposite side edges, wherein a straight indent is at the top surface and is substantially parallel to the two opposite side edges of the top plate. Each side plate has an inwardly inclined portion and a lead. The inwardly inclined portions of the two side plates extend from two opposite side edges of the top plate, respectively, and incline inwardly, wherein a distance between joints of the inwardly inclined portions of the two side plates and the two opposite side edges of the top plate is substantially equal to a thickness of a memory module. The two leads extend from bottoms of the two inwardly inclined portions, respectively, and incline outwardly.

In one embodiment, in accordance with the another heat sink clip of the present invention, multiple air vents are at the two inwardly inclined portions. After the heat sink clip clips the memory module, the air vents at the two inwardly inclined portions are separate from chips of the memory module.

Compared to the prior art, the heat sink clip of the present invention can provide an improved clipping effects. Accordingly, the heat sink clip can tightly clip the memory module so as to improve heat spreading. Besides, the heat sink clip of the invention has a simplified structure that can be formed using automatically punching. Thus, it is cost effectiveness.

Besides, the present invention is further directed to a method of forming the above heat sink clip. The method includes performing a cutting process of cutting into a plate with a specific profile; performing a first bending process of bending the plate into a primary plate including the top plate and the two side plates, wherein each of the side plates includes an inwardly inclined portion and a lead, and the lead of each side plate is bent slightly upward; performing a second bending process of bending the primary plate into a prototype heat sink clip including the top plate and the two side plates facing opposite; performing a shaping process of having the inwardly inclined portions of the two side plates facing opposite incline inwardly.

In one embodiment, the present invention is further directed to another method of forming the above heat sink clip, which is similar to the above method. The main difference is that the primary plate formed using the first bending process includes a top plate and two side plates, wherein each side plate includes a top portion, an inwardly inclined portion and a lead. The inwardly inclined portions of the two side plates are bent slightly downward such that bends are formed at joints of the two inwardly inclined portions and the two top portions, respectively. The leads of the two side plates are bent slightly upward.

In one embodiment, the above methods of the present invention further includes a hole punching process, before the first bending process, to form two lines of air vents at predetermined positions of the plate. The two lines of air vents are at the inwardly inclined portions or top portions of the two side plates subsequently formed, respectively.

The accompanying drawings are included to provide a further understanding of the invention, and are incorporated as a part of this specification. The drawings illustrate embodiments of the invention and, together with the description, serve to explain the principles of the invention.

DETAILED DESCRIPTION OF THE INVENTION

Illustrative embodiments accompanying with figures are now described below to lead the characteristics, contents, advantages and effects of the invention to be understood by the Examiner. Figures are illustrated only for explanation, but are not drawn to scale and precise arrangement, and thus the scope of the invention should not be limited by the scale and arrangement illustrated in the figures.

Figure 1:
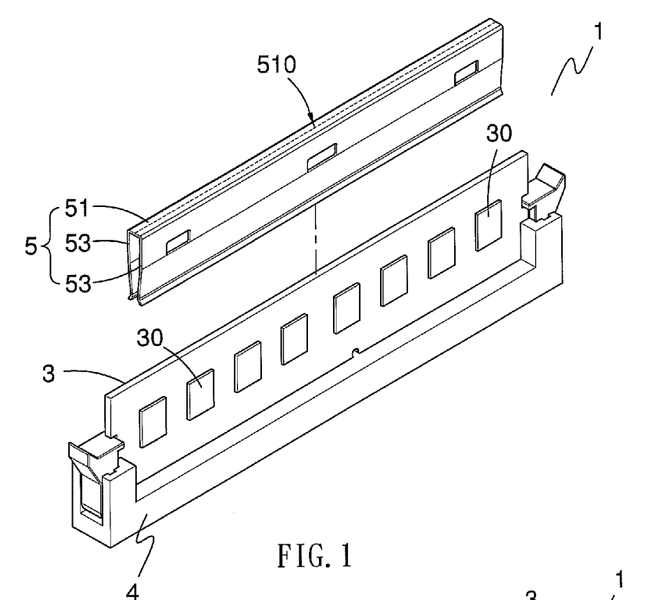
FIG. 1 is a three-dimensional view before assembly in accordance with an embodiment of the present invention.
Figure 2:
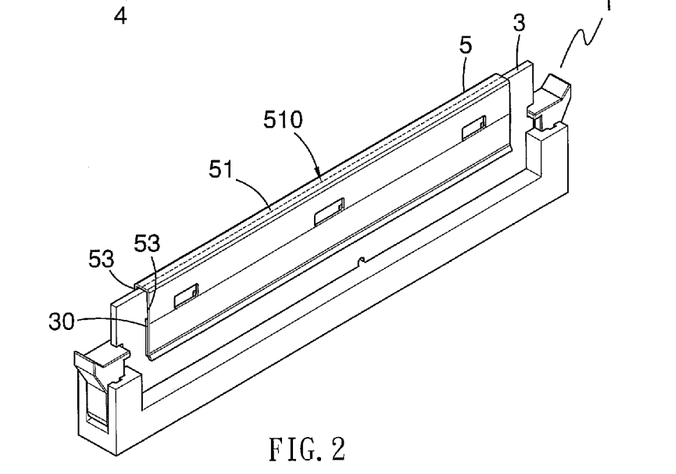
FIG. 2 is a three-dimensional view after assembly in accordance with the embodiment.

FIGS. 1 and 2 are schematic views of a memory device in accordance with an embodiment of the present invention. The memory device 1 includes a memory module 3 and a heat sink clip 5. The memory module 3 can be a dual in line memory module (DIMM) plugged in a memory socket 4 of a main board of a computer. The memory module 3 includes multiple chips 30 at front and back sides thereof, respectively. The heat sink clip 5 is made from a flexible heat-conductive metal plate formed by bending, and includes a top plate 51 and two side plates 53. The two side plates 53 extend from two opposite side edges of the top plate 51 respectively and face opposite. As shown in FIG. 2, the heat sink clip 5 clips the memory module 3 with the two side plates 53 tightly contacting the chips 30 of the memory module 3 such that heat generated from the chips can be transmitted to the heat sink clip 5 for heat spreading.

Figure 3:
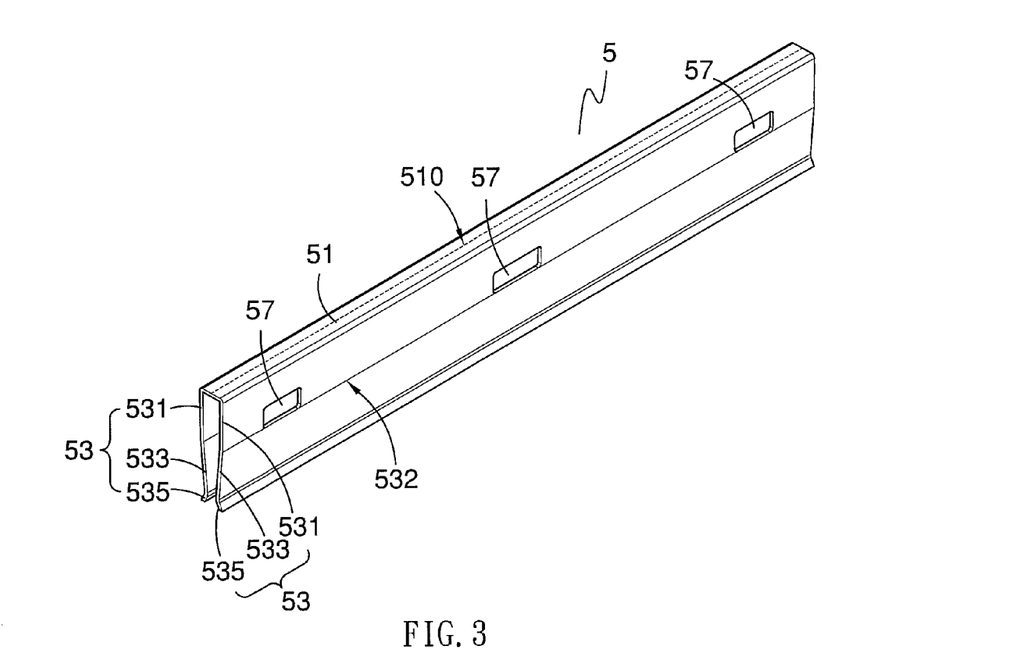
FIG. 3 is a three-dimensional view of a heat sink clip in accordance with the embodiment.
Figure 4:
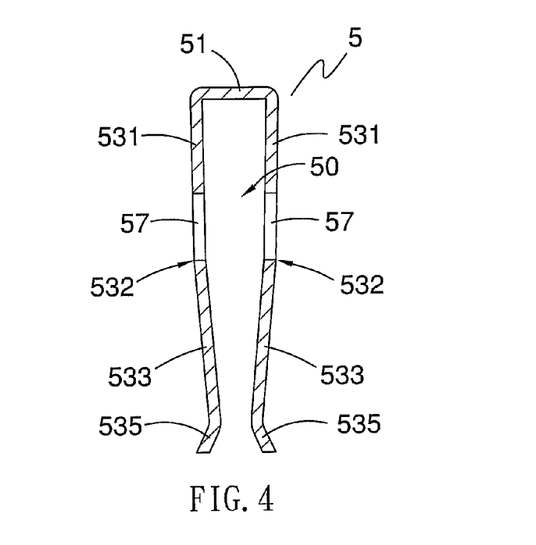
FIG. 4 is a cross sectional view of the heat sink clip in accordance with the embodiment.

FIGS. 3 and 4 show the heat sink clip 5 in accordance with the embodiment. Referring to FIGS. 3 and 4, the top plate 51 has a planar bottom surface, and a straight indent 510 is at a top surface of the top plate 51. The straight indent 510 is substantially parallel to the two opposite side edges of the top plate 51 and close to a center of the top plate 51. Besides, each side plate 53 has a top portion 531, an inwardly inclined portion 533 and a lead 535. The two top portions 531 extend from two opposite side edges of the top plate 51, respectively, and incline inwardly. The two inwardly inclined portions 533 extend from bottoms of the two top portions 531, respectively, and continue to incline inwardly such that a bend 532 is formed at a joint of each inwardly inclined portion 533 and each top portion 531 connected thereto. The two leads 535 extend from bottoms of the two inwardly inclined portions 533, respectively, and incline outwardly. Multiple air vents 57 are at the top portions 531 of the two side plates 53. Preferably, after the heat sink clip 5 is mounted on the memory module 3, the air vents 57 at the top portions 531 of the two side plates 53 are separate from the chips 30 of the memory module 3, and thereby the air vents 57 can be prevented from being blocked by the chips 30 of the memory module 3. Accordingly, the heat sink clip 5 can improve to spread heat away from the memory module 3.

Figure 5:
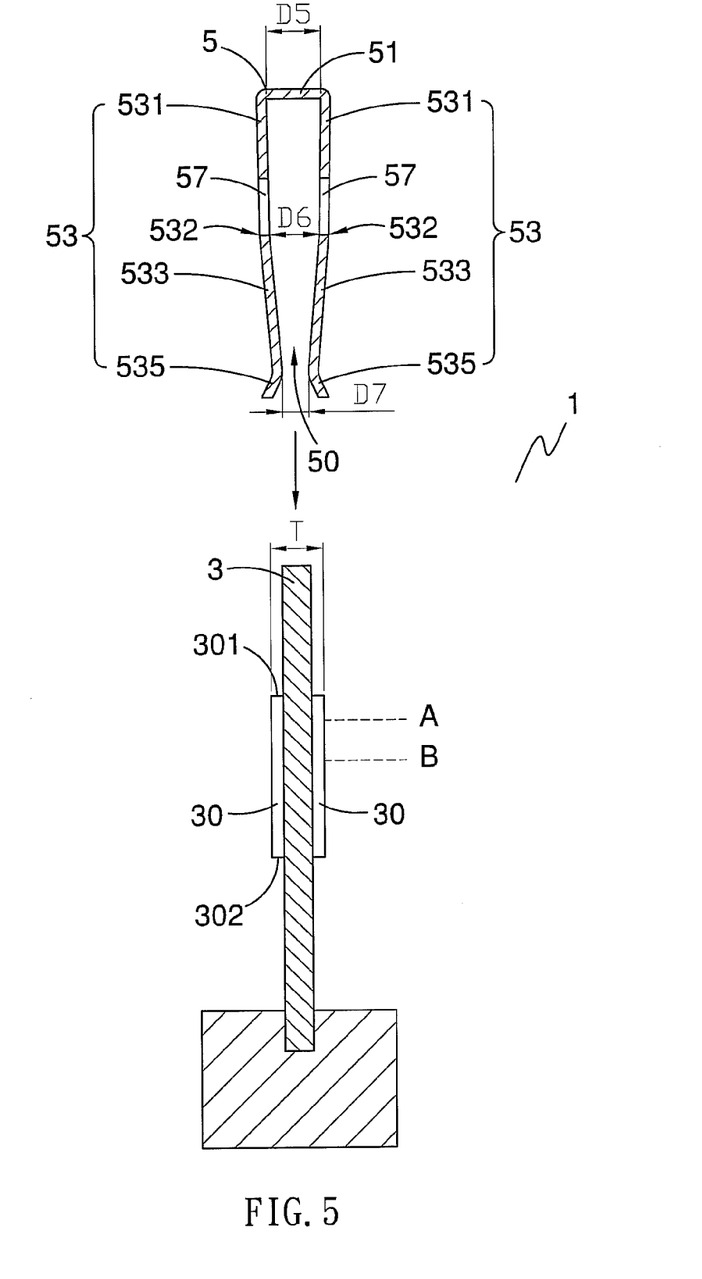
FIG. 5 is a cross sectional view in accordance with the embodiment.

Referring to FIG. 5, a distance D5 between joints of the two top portions 531 and the top plate 51 is substantially equal to a thickness T of the memory module 3. A distance D6 between bottoms of the two top portions 531 is slightly less than the thickness T of the memory module 3. A distance D7 between bottoms of the two inwardly inclined portions 533 is less than the distance D6 between the bottoms of the two top portions 531, less than the distance D5 between joints of the two top portions 531 and the top plate 51 and less than the thickness T of the memory module 3. During assembling, a user only needs to align a gap 50 in the heat sink clip 5 with the memory module 3 and then push down the heat sink clip 5, having it move to the memory module 3. At the time, by guiding of the two leads 535 of the two side plates 53, the memory module 3 can be guided to be slid into the gap 50 between the two side plates 53, as shown in FIG. 2.

After the heat sink clip 5 and the memory module 3 are assembled, the two side plates 53 of the heat sink clip 5 can be stretched outward by the memory module 3 such that the two top portions 531 have the original situation of slightly inward inclination that can be turned into a parallel situation, and the two inwardly inclined portions 533 have the original situation of inward inclination that can be turned into a situation without any inward inclination. Because the heat sink clip 5 is made from a flexible heat-conductive metal plate, the two top portions 531 and the two inwardly inclined portions 533 can provide an elastic force of inward clipping when the heat sink clip 5 is stretched outward by the memory module 3. The heat sink clip 5 can tightly clip the memory module 3 by the elastic force such that the two side plates 53 can tightly contact the chips 30 of the memory module 3 and heat generated from the chips 30 can be spread easily.

Besides, after the heat sink clip 5 and the memory module 3 are assembled, the bends 532 are positioned between top edges 301 and bottom edges 302 of the chips 30 such that the heat sink clip 5 has improved clipping effects. Further, the bends 532 are positioned at upper portions of the chips 30, and a ratio of a distance between the bends 532 and the top edges 301 of the chips 30 to a distance between the top and bottom edges 301 and 302 of the chips 30 ranges from 15% to 40%. For example, if a distance between top and bottom edges of the chip is 10 mm, the bend 532 is positioned between a top limit A of 1.5 mm away from the top edge 301 and a bottom limit B of 4 mm away from the top edge 301.

Compared to prior art, in accordance with the heat sink clip 5 of the present invention, due to both of the distances D5 and D6 between the ends of the top portions 531 and between the ends of the two inwardly inclined portions 533 being less than the thickness T of the memory module 3, the memory module 3 can be tightly clipped. The top portions 531 and inwardly inclined portions 533 of the two side plates 53 of the heat sink clip 5 can improve clipping effects on the memory module 3. Accordingly, the heat sink clip 5 can tightly clip the memory module 3 so as to improve heat spreading. Besides, the two inwardly inclined portions 533 of the heat sink clip 5 incline directly inwardly from the two top portions 531 such that forming a mold for the heat sink clip 5 can be simplified and the cost of forming the mold can be saved.

Figure 6:
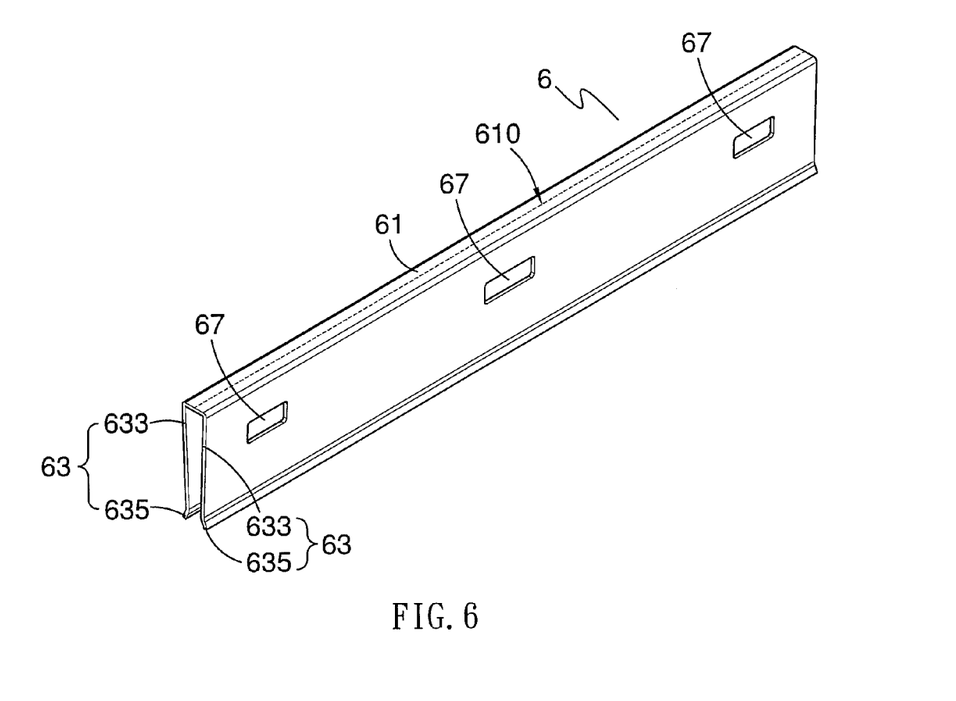
FIG. 6 is a three-dimensional view of another heat sink clip in accordance with the invention.
Figure 7:
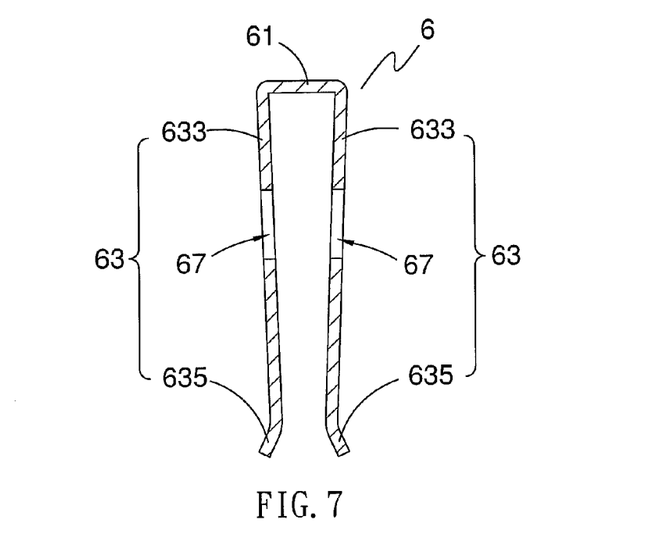
FIG. 7 is a cross sectional view of the heat sink clip of FIG. 6.

FIG. 6 is a three-dimensional view of another heat sink clip 6 of the memory device in accordance with the present invention. The above heat sink clip 5 of the memory device can be replaced with the heat sink clip 6 including a top plate 61 and two side plates 63. Referring to FIGS. 6 and 7, each side plate 63 of the heat sink clip 6 only includes an inwardly inclined portion 633 and a lead 635. The two inwardly inclined portions 633 extend from two opposite side edges of the top plate 61, respectively, and incline inwardly. The two leads 635 extend from bottoms of the two inwardly inclined portions 633, respectively, and incline outwardly. Multiple air vents 67 are at the two inwardly inclined portions 633 of the two side plates 63. After the heat sink clip 6 is mounted on the memory module 3, the air vents 67 are separate from the chips 30 of the memory module 3, and thereby the heat sink clip 6 can improve heat spreading. Besides, an indent 610 is at a top surface of the top plate 61. The indent 610 is substantially parallel to the two opposite side edges of the top plate 61 and close to a center of the top plate 61.

Figure 8:
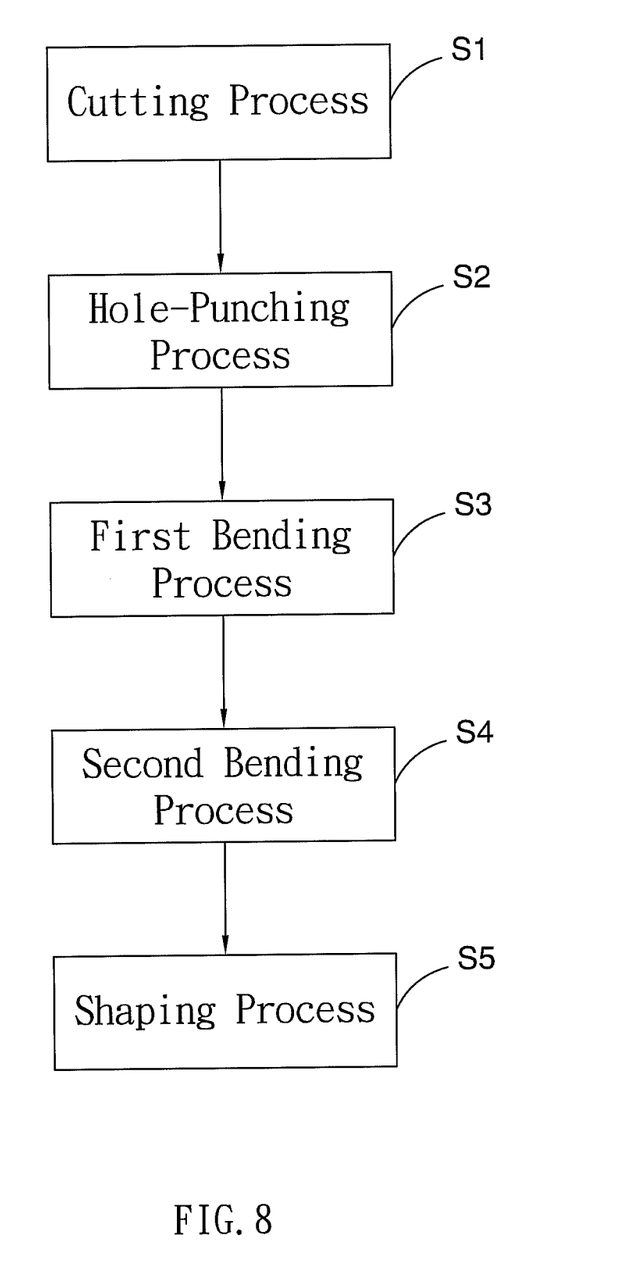
FIG. 8 is a flow chart of fabricating the heat sink clip in accordance with the present invention.

FIG. 8 is a flow chart of a method for fabricating a heat sink clip in accordance with the present invention. The method is performed, for example, by continuously punching a mold, but is not limited. The method includes, in sequence, performing a cutting process S1, performing a hole-punching process S2, performing a first bending process S3, performing a second bending process S4 and performing a shaping process S5.

Figure 9:
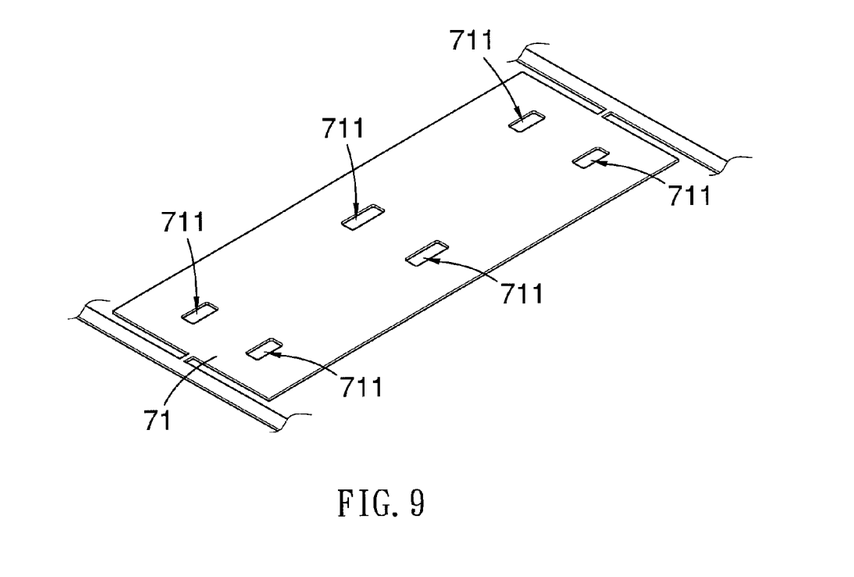
FIG. 9 is a three dimensional view of a plate formed using a hole punching process in accordance with the embodiment.

Referring to FIG. 9, the cutting process S1 includes cutting into a plate 71 with a specific profile from a roll of metal sheet, wherein the plate 71 is substantially rectangle-shaped. The hole-punching process S2 is performed to form multiple air vents 711 at predetermined positions of the plate 71.

Figure 10:
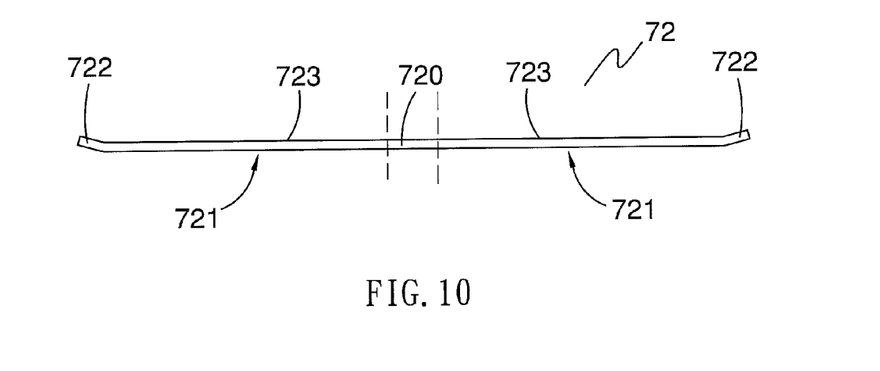
FIG. 10 is a cross sectional view of a primary plate formed using a first bending process in accordance with the embodiment.

The first bending process S3 includes bending the plate 71 into a primary plate 72, as shown in FIG. 10. The primary plate 72 includes a top plate 720, corresponding to the top plate 61 of the heat sink clip 6, and two side plates 721, corresponding to the two side plates 63 of the heat sink clip 6. Each side plate 721 includes an inwardly inclined portion 723 and a lead 722. The inwardly inclined portions 723 of the two side plates 721 extend from two opposite side edges of the top plate 720, respectively and the leads 722 of the two side plates 721 extend from the two inwardly inclined portions 723.

Figure 11:
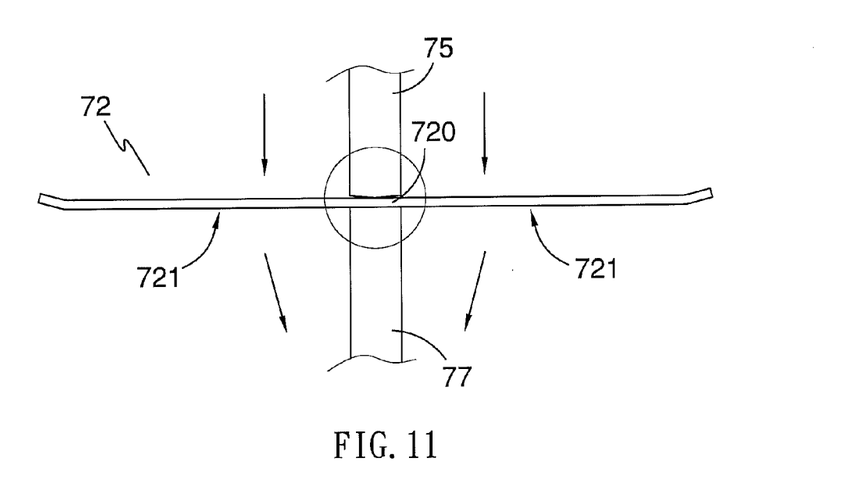
FIG. 11 is a schematic view of a second bending process in accordance with the embodiment.
Figure 12:
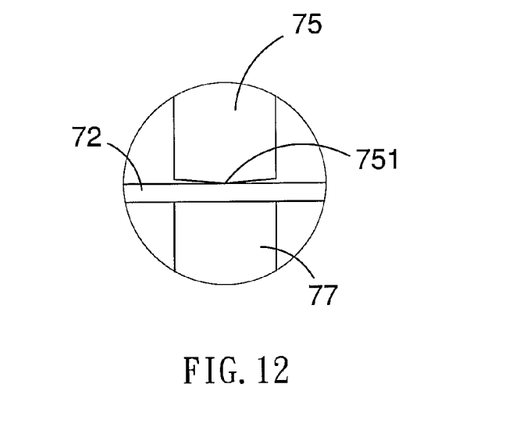
FIG. 12 is a partial enlarged view of FIG. 11.

The second bending process S4 includes bending the primary plate 72 into a prototype heat sink clip. As shown in FIG. 11, in the second bending process S4, a top block 75 and a bottom block 77 tightly clip a center of the top plate 720 of the primary plate 72, and the two side plates 721 can be punched using two side blocks (not shown) such that the two side plates 721 can be downward bent, and thereby the prototype heat sink clip can be formed. The prototype heat sink clip has substantially the same structure as the heat sink clip 6, as shown in FIGS. 6 and 7. The shaping process S5 includes inwardly pushing the two side plates of the prototype heat sink clip such that inwardly inclined portions of the two side plates incline inwardly, and thereby the heat sink clip 6 can be formed.

In the second bending process S4, in order to avoid a shift of the primary plate 72 when being bent, wherein the shift could cause the two side plates of the prototype heat sink clip to have different lengths, the top block 75 may include a ridge 751 at a bottom thereof. The ridge 751 and the bottom block 77 can tightly clip the primary plate 72 and thus the primary plate 72 shifts hard. Because the top plate 61 of the prototype heat sink clip is tightly pressed by the ridge 751 or the top block 75, an indent 610, that is the indents of the heat sink clips 5 and 6, is formed at the top plate 61 of the prototype heat sink clip, substantially parallel to two opposite side edges of the top plate 61 and close to a center of the top plate 61, as shown in FIG. 6.

Figure 13:
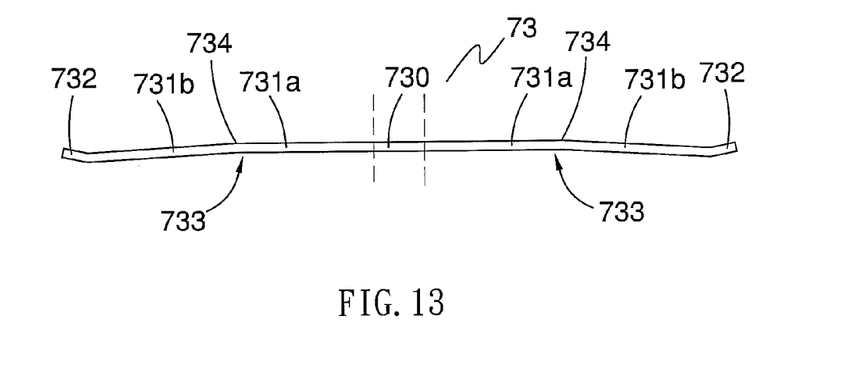
FIG. 13 is a cross sectional view of another primary plate formed using a first bending process in accordance with another method of a heat sink clip of the invention.

The present invention is further directed to another method of forming another heat sink clip 5, which is similar to the above method. The method also includes a cutting process, a hole-punching process, a first bending process, a second bending process and a shaping process. The main difference is that the primary plate 73, as shown in FIG. 13, bent from the plate using the first bending process includes a top plate 730 and two side plates 733, wherein each side plate 733 includes a top portion 731a, an inwardly inclined portion 731b and a lead 732. The inwardly inclined portions 731b of the two side plates 733 are bent slightly downward such that bends 734 are formed at joints of the two inwardly inclined portions 731b and the two top portions 731a, respectively. The leads 732 of the two side plates 733 are bent slightly upward. The top plate 730 corresponds to the top plate 51 of the above heat sink clip 5; the two side plates 733 corresponds to the two side plates 53 of the above heat sink clip 5. Next, the second bending process is performed to bend the primary plate 73 into a prototype heat sink clip including the top plate 730 and the two side plates 733 facing opposite. Next, the shaping process is performed to inwardly pushing the two side plates of the prototype heat sink clip such that the top portions 731a of the two side plates 733 of the prototype heat sink clip incline inwardly, and thereby the heat sink clip 5 can be formed.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:
1. A heat sink clip for clipping a memory module that has a top part and two side parts, and spreading heat away from a chip of the memory module, wherein the heat sink clip is made from a flexible heat-conductive metal plate formed by bending, and comprises:

a top plate having a top surface, a planar bottom surface and two opposite side edges, wherein a straight indent is at the top surface of the top plate and is parallel to the two opposite side edges of the top plate; and two side plates facing opposite from each other and each having a top portion, an inwardly inclined portion and a lead, wherein the top portions of the two side plates directly extend from the two opposite side edges of the top plate, respectively, and incline inwardly, wherein a distance between joints of the top portions of the two side plates and the two opposite side edges of the top plate is equal to a thickness of the memory module, wherein the inwardly inclined portions of the two side plates directly extend from bottoms of the two top portions, respectively, and continue to further incline inwardly such that bends are at joints of the two inwardly inclined portions and the two top portions, respectively, wherein the leads of the two side plates directly extend from bottoms of the two inwardly inclined portions, respectively, and incline outwardly;

wherein the planar bottom surface of the top plate is for facing the top part of the memory module, and the two side plates is for directly clipping the two side parts thereof respectively.

2. The heat sink clip of claim 1, wherein each bend is located in between a top edge and a bottom edge of the chip.

3. The heat sink clip of claim 1, wherein a ratio of a distance between one of the bends and a top edge of the chip of the memory module to a distance between the top edge and a bottom edge of the chip ranges from 15% to 40%.

4. The heat sink clip of claim 3, wherein multiple air vents are at the top portion of each side plate.

5. The heat sink clip of claim 1, wherein the top portions of the two side plates are bent directly at the two opposite side edges of the top plate.

6. The heat sink clip of claim 1, wherein each of the two side plates forms an acute angle with the top plate.

7. The heat sink clip of claim 1, wherein a degree of an inward incline of the inwardly inclined portion of each of the two side plates is higher than a degree of an inward incline of the top portion of a corresponding one of the two side plates.

8. A heat sink clip for clipping a memory module that has a top part and two side parts, and spreading heat away from a chip of the memory module, wherein the heat sink clip is made from a flexible heat-conductive metal plate formed by bending, and comprises:

a top plate having a top surface, a planar bottom surface and two opposite side edges, wherein a straight indent is at the top surface and is parallel to the two opposite side edges of the top plate; and two side plates facing opposite from each other and each having an inwardly inclined portion and a lead, wherein the inwardly inclined portions of the two side plates directly extend from the two opposite side edges of the top plate, respectively, and incline inwardly, wherein a distance between joints of the inwardly inclined portions of the two side plates and the two opposite side edges of the top plate is equal to a thickness of the memory module, wherein the two leads directly extend from bottoms of the two inwardly inclined portions, respectively, and incline outwardly;

wherein the planar bottom surface of the top plate is for facing the top part of the memory module, and the two side plates is for directly clipping the two side parts thereof respectively.

9. The heat sink clip of claim 8, wherein multiple air vents are at the two inwardly inclined portions, wherein the air vents at the two inwardly inclined portions are separate from the chip of the memory module after the heat sink clip clips the memory module.

10. The heat sink clip of claim 8, wherein the inwardly inclined portion of the two side plates are bent directly at the two opposite side edges of the top plate.

11. The heat sink clip of claim 8, wherein each of the two side plates forms an acute angle with the top plate.

\* \* \* \* \*